(12) United States Patent
Kamikawa et al.

(10) Patent No.: US 8,851,819 B2
(45) Date of Patent: Oct. 7, 2014

(54) SUBSTRATE PROCESSING APPARATUS

(75) Inventors: Yuji Kamikawa, Tosu (JP); Takafumi Tsuchiya, Tosu (JP); Koji Egashira, Tosu (JP)

(73) Assignee: Tokyo Electron Limited, Minato-Ku (JP)

( * ) Notice: Subject to any disclaimer, the term of this patent is extended or adjusted under 35 U.S.C. 154(b) by 482 days.

(21) Appl. No.: 12/706,958

(22) Filed: Feb. 17, 2010

(65) Prior Publication Data

US 2010/0215461 A1 Aug. 26, 2010

(30) Foreign Application Priority Data

Feb. 20, 2009 (JP) .................................. 2009-38431

(51) Int. Cl.
*B65G 65/00* (2006.01)
*H01L 21/677* (2006.01)

(52) U.S. Cl.
CPC .... *H01L 21/67727* (2013.01); *H01L 21/67733* (2013.01); *H01L 21/67769* (2013.01); *H01L 21/67736* (2013.01); *Y10S 414/14* (2013.01)
USPC ........................ 414/281; 414/940; 414/222.07

(58) Field of Classification Search
USPC .......... 414/222.13, 411, 217, 222.01, 222.07, 414/222.08, 222.09, 266, 281, 282, 360, 414/940, 935, 937
See application file for complete search history.

(56) References Cited

U.S. PATENT DOCUMENTS

| | | | | |
|---|---|---|---|---|
| 5,443,346 A | * | 8/1995 | Murata et al. | 414/222.13 |
| 5,562,383 A | * | 10/1996 | Iwai et al. | 414/217.1 |
| 6,092,678 A | * | 7/2000 | Kawano et al. | 212/86 |
| 6,129,496 A | * | 10/2000 | Iwasaki et al. | 414/222.01 |
| 6,169,935 B1 | * | 1/2001 | Iwasaki et al. | 700/214 |
| 6,379,096 B1 | * | 4/2002 | Beutler et al. | 414/281 |
| 6,575,178 B1 | * | 6/2003 | Kamikawa | 134/88 |
| 6,582,182 B2 | * | 6/2003 | Whalen | 414/276 |
| 6,663,332 B1 | * | 12/2003 | Sluijk et al. | 414/160 |
| 6,772,032 B2 | * | 8/2004 | Iwasaki et al. | 700/113 |
| 6,799,521 B2 | * | 10/2004 | Tai et al. | 104/88.01 |
| 7,661,919 B2 | * | 2/2010 | Bonora et al. | 414/222.01 |
| 7,740,437 B2 | * | 6/2010 | De Ridder et al. | 414/217.1 |

(Continued)

FOREIGN PATENT DOCUMENTS

| | | |
|---|---|---|
| JP | 11-176908 A1 | 7/1999 |
| JP | 2003-168714 A1 | 6/2003 |

(Continued)

OTHER PUBLICATIONS

Japanese Office Action (Application No. 2013-035976) dated Dec. 24, 2013.

*Primary Examiner* — Saul Rodriguez
*Assistant Examiner* — Glenn Myers
(74) *Attorney, Agent, or Firm* — Burr & Brown, PLLC

(57) ABSTRACT

A substrate processing apparatus, which utilizes a first transfer apparatus and a second transfer apparatus which are configured to transfer a transfer container containing a plurality of substrates, along a first transfer path and a second transfer path whose lateral positions differ from each other, respectively, including a first load port where the transfer container is loaded and unloaded by the first transfer apparatus, and a second load port that is arranged stepwise with respect to the first load port, with the transfer container being loaded to and unloaded from the second load port by the second transfer apparatus.

3 Claims, 11 Drawing Sheets

(56) References Cited

U.S. PATENT DOCUMENTS

| | | |
|---|---|---|
| 7,934,880 B2 * | 5/2011 | Hara et al. .................... 396/611 |
| 8,128,333 B2 * | 3/2012 | Aburatani .................... 414/411 |
| 2007/0163461 A1 * | 7/2007 | Shiwaku ........................ 104/89 |
| 2009/0024244 A1 * | 1/2009 | Harris et al. .................. 700/121 |
| 2009/0053665 A1 | 2/2009 | Haraki et al. |
| 2010/0047045 A1 * | 2/2010 | Park et al. ................. 414/222.07 |
| 2012/0237323 A1 * | 9/2012 | Sugawara .................... 414/411 |

FOREIGN PATENT DOCUMENTS

| | | |
|---|---|---|
| JP | 2006-114561 A1 | 4/2006 |
| JP | 2006-120658 A1 | 5/2006 |
| JP | 2008-263004 | 10/2008 |
| JP | 2008-277764 | 11/2008 |
| JP | 2009-260087 A1 | 11/2009 |
| JP | 2009-278027 A1 | 11/2009 |

* cited by examiner

SUBSTRATE PROCESSING APPARATUS

CROSS REFERENCE TO RELATED APPLICATIONS

This application is based upon and claims the benefit of priority from the prior Japanese Patent Application No. 2009-38431 filed on Feb. 20, 2009, the entire contents of which are incorporated herein by reference.

FIELD OF THE INVENTION

The present invention relates to a substrate processing apparatus comprising a load port in which a transfer container containing a plurality of substrates can be placed, and a container storage part in which the transfer container can be stored, for performing various processes to the substrates which are drawn from the transfer container. In particular, the present invention relates to a substrate processing apparatus capable of efficiently performing a loading operation and an unloading operation of the transfer container.

BACKGROUND OF THE INVENTION

Generally, a semiconductor manufacturing apparatus comprises: a load port into which a transfer container containing a plurality of substrates is loaded; a substrate transfer mechanism configured to draw the substrates from the transfer container and to return the processed substrates to the transfer container; and a processing part configured to perform various processes to the substrates. As the transfer container, there is used, instead of a conventional open-type carrier, a FOUP (Front Opening Unified Pod) having a lid member for opening and closing a front surface thereof. Thus, the semiconductor manufacturing apparatus is provided with a mechanism for opening and closing the lid member of the FOUP.

As a process for a substrate, there are a single-wafer process, such as a vacuum process, and a coating and developing process (a coating process of a resist and a developing process after exposure), and a batch process, such as a thermal process by a vertical thermal processing apparatus and a substrate cleaning process. When a single-wafer process is performed, a substrate is generally drawn from a transfer container placed in a load port. On the other hand, when a batch process is performed, a transfer container is temporarily stored in a container storage part, which is called "stocker" provided between a load port and a processing part, so that stagnation of the transfer containers on the load port can be prevented, whereby a process can be effectively performed.

In a cleaning apparatus of a batch type, for example, a batch process is performed such that fifty semiconductor wafers (hereinafter referred to as "wafers") are arranged in a cleaning container, and the wafers are sequentially immersed into a plurality of cleaning tanks. By improving a mechanism that draws the substrates from the transfer container and transports the substrates to the cleaning container, a series of processes have been recently accelerated. Although there is developed an apparatus whose throughput (process capability) is about six hundred substrates per hour, a still higher throughput is required. For example, assuming that the transfer container can contain twenty-five substrates, in order to process nine hundred substrates per hour, thirty-six transfer containers should be loaded into a load port from a transfer apparatus, specifically, e.g., an overhead transfer apparatus (an in-plant transfer apparatus of a overhead traveling type: OHT), which is disposed on a factory. In this case, the number of times of the loading operations and the unloading operations is seventy-two (36×2).

The number of stages for the transfer containers aligned in the load port is generally three or four. However, in order to cope with the above requirement, the number of stages aligned in the load port should be increased to, e.g., about eight. However, when the number of stages aligned therein is increased, a width of the apparatus is widened. Since a rear side area of the lord port is a dead space, the dead space is added to an installation area. As a result, because of the increased installation space, such a structure cannot be employed.

JP2008-277764A describes the following technique. Namely, a waiting position, in which a plurality of FOUPs can wait is provided on an upper surface of a ceiling part of a substrate processing apparatus. A FOUP supplied from an overhead transfer apparatus is temporarily located in the waiting position, and then the FOUP is moved by a moving mechanism to a support plate member above a load port. Thereafter, the FOUP is loaded into the load port from the support plate member by the overhead transfer apparatus.

JP2008-263004A describes the following structure. Namely, in a CVD apparatus of a single-wafer type, there are formed three load ports by arranging three lower FOUP stages, which can be moved upward and downward, on a front side of three pod openers (lid-member opening and closing mechanism). In addition, three upper FOUP stages are disposed on an upper surface of a sealing of the apparatus body. Thus, FOUPs can be transported between the upper FOUP stages and the lower FOUP stages.

Although these techniques can prevent stagnation of the FOUPs in the load port, these techniques have limits to achieving a still higher throughput as described above. Thus, a technique for more improving a throughput has been desired.

SUMMARY OF THE INVENTION

The present invention has been made in view of these circumstances. The object of the present invention is to provide a substrate processing apparatus comprising a load port in which a transfer container containing a plurality of substrates is placed, and a container storage part for storing the transfer container, the substrate processing apparatus being capable of increasing the number of times at which the transfer container is transferred to and from the load port, whereby the substrates can be processed with a high throughput.

The substrate processing apparatus according to the present invention is a substrate processing apparatus in which a transfer container containing a plurality of substrates is loaded and unloaded by a transfer system comprising: a first transfer path and a second transfer path whose lateral positions differ from each other above the substrate processing apparatus; and a first transfer apparatus and a second transfer apparatus which transfer the transfer container along the first transfer path and the second transfer path, respectively; and the substrates in the transfer container are drawn from the transfer container by a substrate transfer mechanism and are then processed in a processing part, the substrate processing apparatus comprising: a first load port on which a plurality of container tables are linearly arranged correspondingly to the first transfer path, wherein the transfer container is loaded to and unloaded by the first transfer apparatus; a second load port that is arranged stepwise with respect to the first load port at a position higher than the first load port, on which a plurality of container tables are linearly arranged correspondingly to the second transfer path, wherein the transfer container is loaded to and unloaded by the second transfer apparatus; a container table for transporting substrates on which the transfer container is placed for transporting the substrates in the transfer container between the container table and the substrate transfer mechanism; a container storing part disposed rearward the first load port and the second load port, the container storing part including a plurality of container tables on which the plurality of transfer containers are stored; and a container transfer mechanism configured to transfer the transfer container among the container tables of the first load port, the container tables of the second load port, the container tables of the container storing part, and the container table for transporting substrates.

The substrate processing apparatus may have the following features.

(a) The first load port and the second load port are disposed outside a housing defining an external body of the substrate processing apparatus, and the container storing part is disposed inside the housing; and the container transfer mechanism comprises: an auxiliary transfer mechanism configured to transfer the transfer container between the first load port and an inside position in the housing opposed to the first load port through an opening of the housing; and a main transfer mechanism configured to transfer the transfer container between the inside position and the container table for transporting substrates, and to transfer the transfer container between the respective container tables of the second load port and the container storing part, and the container table for transporting substrates.

(b) The auxiliary transfer mechanism includes a mechanism for horizontally moving the container table of the first load port.

(c) There is provided a shutter for closing the opening, except when the transfer container is moved between the first load port and an area within the housing.

(d) One of the first load port and the second load port is exclusively used for loading the transfer container, and the other thereof is exclusively used for unloading the transfer container.

(e) The first transfer path used in the transfer system is disposed on a floor surface on which the wafer processing apparatus is installed, not being disposed above the substrate processing apparatus.

According to the present invention, there is used the transfer system comprising the first transfer path (the first transfer path disposed on a first surface is included) and the second transfer path whose lateral positions differ from each other, and the first transfer apparatus and the second transfer apparatus configured to transfer the transfer container along the first transfer path and the second transfer path, respectively. On the other hand, corresponding to the two in-plant transfer apparatuses, the substrate processing apparatus includes the first load port (lower level) and the second load port (upper level) which are arranged at two levels. Thus, the number of times at which the transfer containers are transported between the in-plant transfer apparatuses and the wafer processing apparatus can be increased, whereby the substrates can be processed with high throughput.

DETAILED DESCRIPTION OF THE INVENTION

Hereafter, there is described an embodiment in which a substrate processing apparatus according to the present invention is applied to a batch-type wafer cleaning apparatus. Firstly, there is briefly described a structure of a wafer transfer system in a semiconductor manufacturing factory in which the wafer cleaning apparatus is installed.

Figure 1:
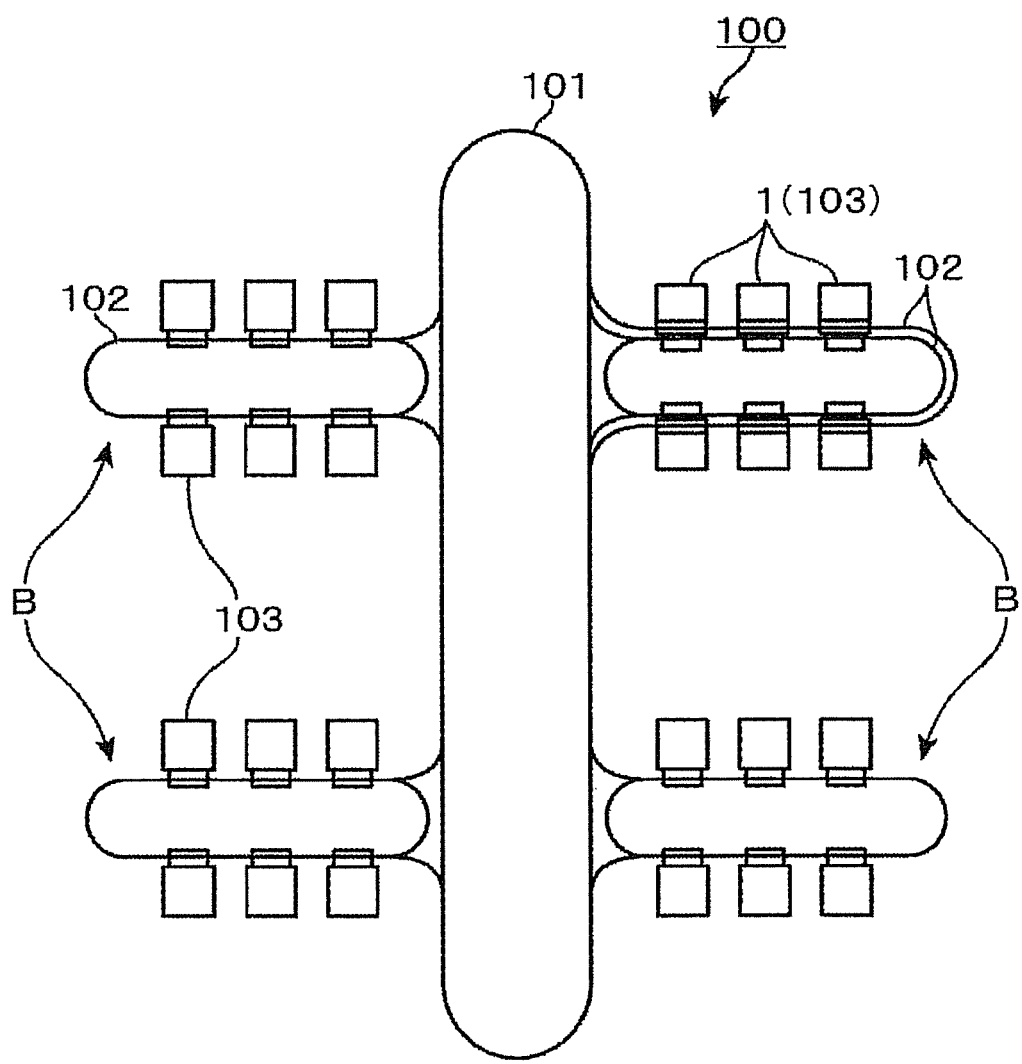
FIG. 1 is a schematic view showing a structural example of a system for transferring a FOUP to a wafer cleaning apparatus in one embodiment of the present invention.

FIG. 1 shows a schematic structure of a wafer transfer system 100 in a semiconductor manufacturing factory in which a wafer cleaning apparatus 1 according to this embodiment is installed. Wafers W are sequentially transferred to various substrate processing apparatuses 103 which are dispersedly disposed in the factory. The wafers W are subjected to processes, such as a resist coating process, an exposing process, a developing process, an etching process, and a cleaning process, in the respective substrate processing apparatuses 103.

In the semiconductor manufacturing factory, the plurality of wafers W are contained in, e.g., the aforementioned FOUP as a transfer container. The FOUP is transferred among the substrate processing apparatuses 103 for performing respective steps, by a transfer robot called "OHT" (Overhead Hoist Transport). In this example, the FOUP can contain a plurality of, e.g., twenty-five wafers W that are horizontally held in a tier-like manner.

The transfer system is composed of a rail track disposed on a ceiling part of the factory, and the OHT configured to travel on the rail track. In the semiconductor manufacturing factory, there are formed processing blocks B in which the plurality of substrate processing apparatuses 103 are gathered in accordance with respective processing steps. A between-step transfer path 101 formed of the above rail track connects the plurality of processing blocks B to each other. In-step transfer paths 102 are branched from the between-step transfer path 101, and are extended above the substrate processing apparatuses 103 disposed in the respective processing blocks B, whereby the FOUP can be transported between load ports of the respective substrate processing apparatuses 103.

In the transfer system as structured above, the processing bock B (which is located on in an upper right area of FIG. 1 in this example), in which the wafer cleaning apparatuses 1 according to this embodiment are disposed, is provided with a multiple in-step transfer path 102, e.g., two in-step path 102, in order to eliminate mismatch of a processing speed at which the wafers W are processed by the wafer processing apparatuses 1 and a loading and unloading speed of the FOUP by the transfer system.

Figure 2:
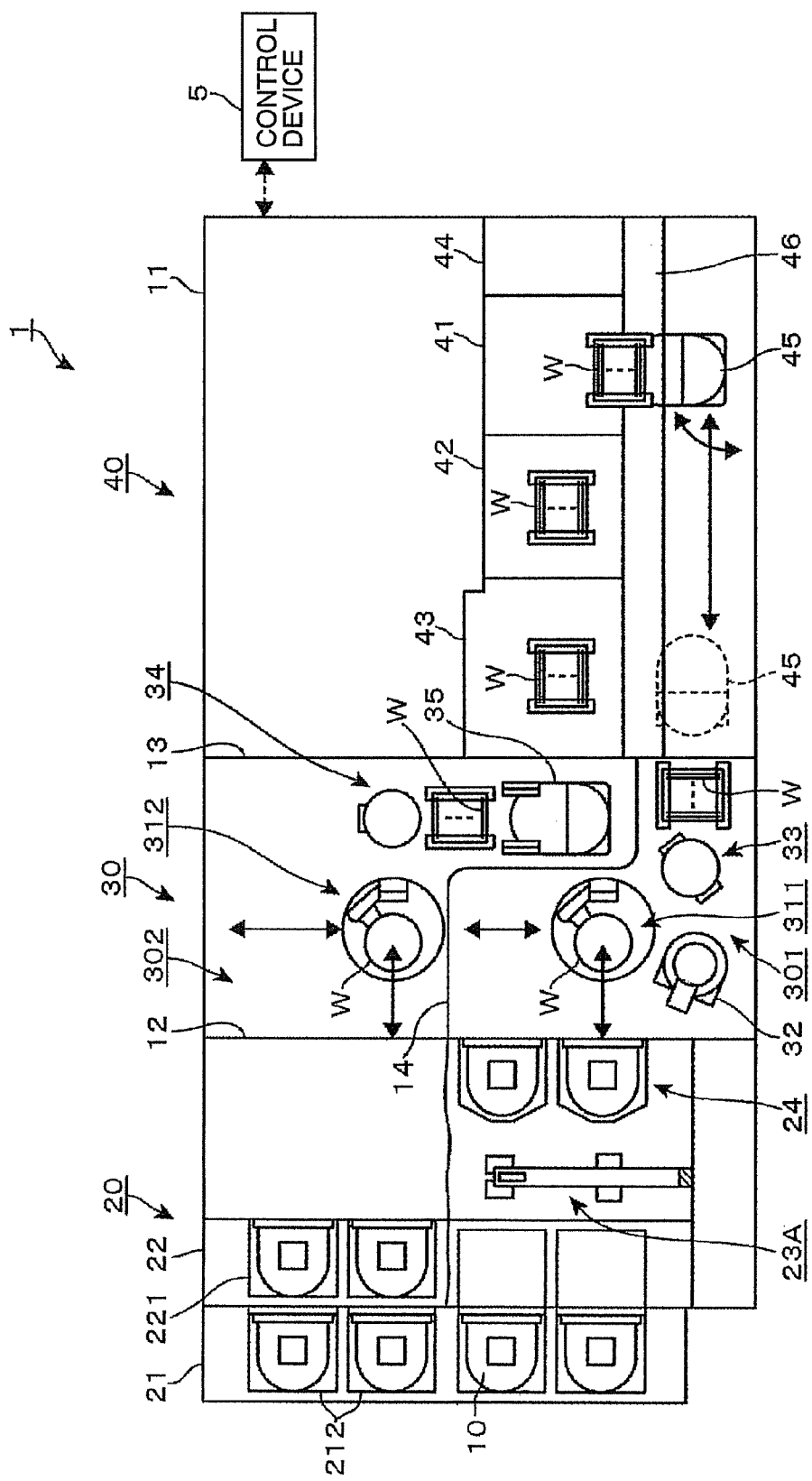
FIG. 2 is a sectional plan view of the wafer cleaning apparatus.
Figure 3:
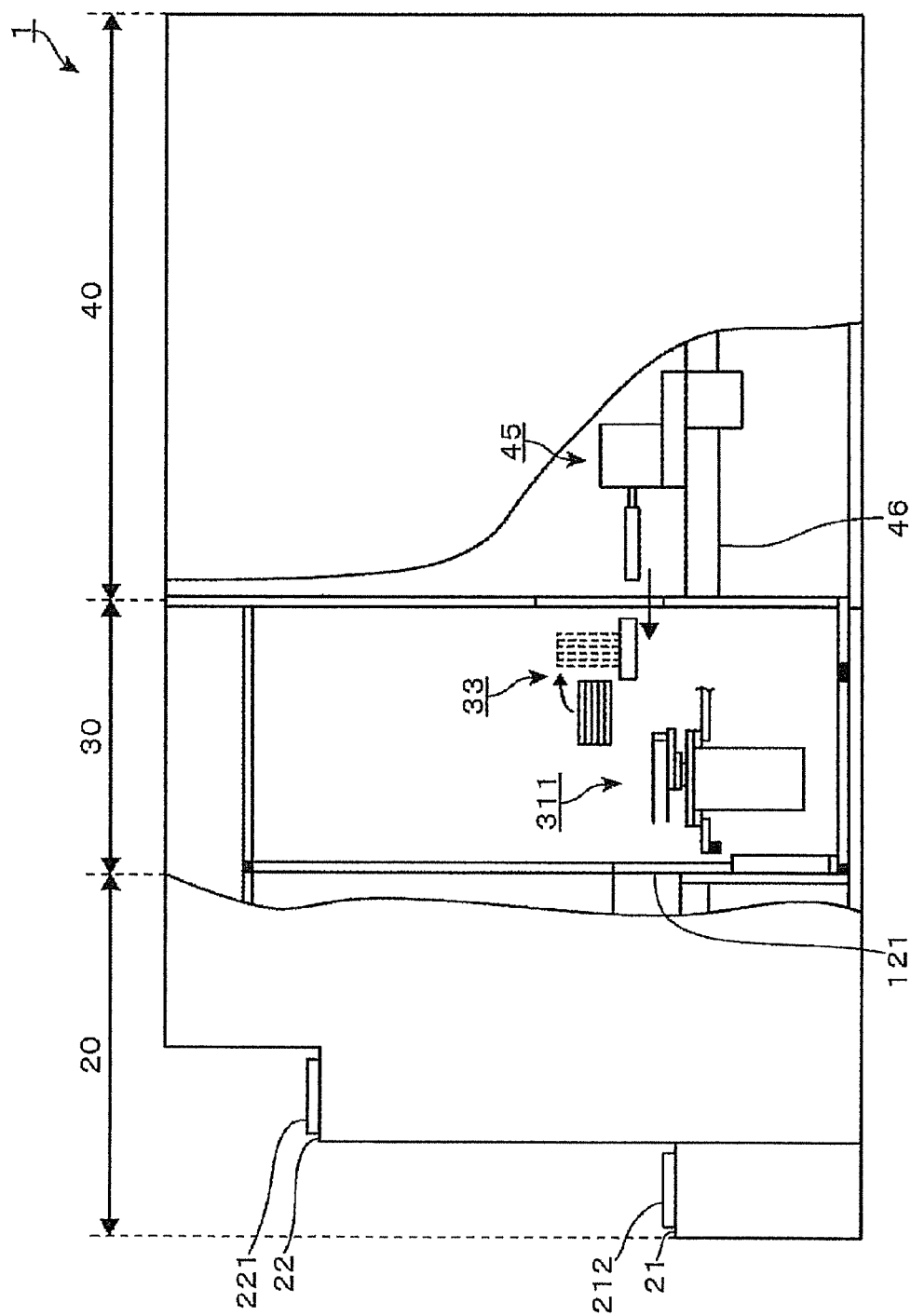
FIG. 3 is a longitudinal side view showing an inside structure of an interface part disposed in the wafer cleaning apparatus.
Figure 4:
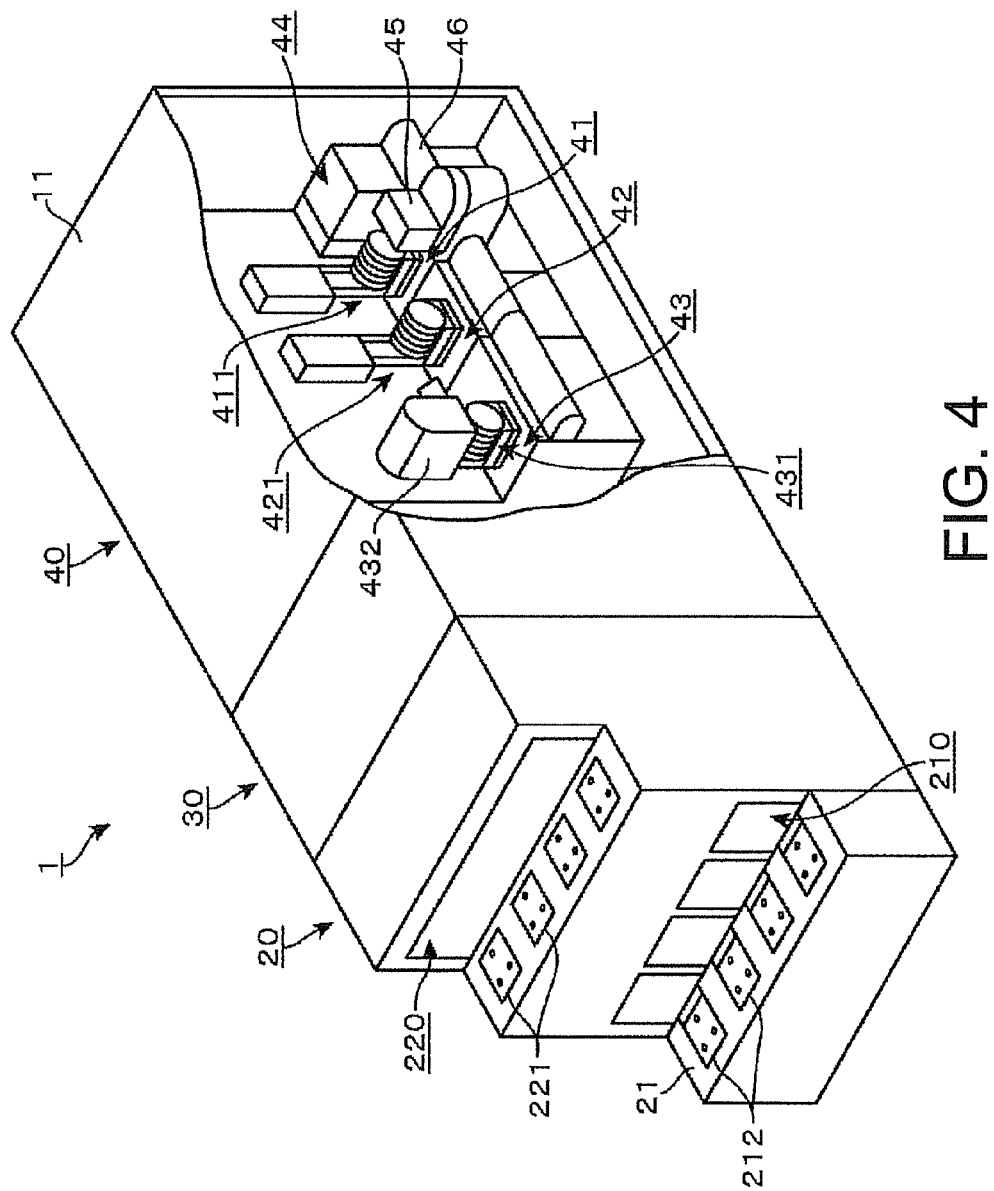
FIG. 4 is a partially cutaway perspective view showing an inside structure of a processing part disposed in the wafer cleaning apparatus.

The FOUP can be transported between the wafer cleaning apparatus 1 according to this embodiment and the OHT that travels along the multiple step-in transfer path 102. Hereafter, a structure of the wafer cleaning apparatus 1 is described. FIG. 2 is a plan view of the wafer cleaning apparatus 1 according to this embodiment, FIG. 3 is a longitudinal side view thereof, and FIG. 4 is a perspective view thereof. In these drawings, assuming that the left side thereof is a front side, the wafer cleaning apparatus 1 comprises a housing 11 in which a loading and unloading part 20 through which a FOUP 10 is loaded and unloaded, an interface part 30, and a processing part 40 configured to perform a liquid process and a drying process for a wafer W, which are arranged, in this order from the front side. The interface part 30 is configured to adjust a position of the wafer W and to change a posture thereof, in the course of transporting the wafer W, which have been drawn from the FOUP 10, between the loading and unloading part 20 and the processing part 40.

The loading and unloading part 20 serves as a part through which the FOUP 10, which has been transferred by the OHT traveling along the step-in transfer path 102, is loaded into the apparatus 1, and also serves as a stock area (stocker) where the vacant FOUP 10, from which wafers W have been drawn, is stored during the process of the wafers W. The detailed structure thereof will be described below.

As shown in FIGS. 2 and 3, the interface part 30 separates a space inside the housing 11 as an external body of the wafer cleaning apparatus from the loading and unloading part 20 and the processing part 40 by a front separation wall 12 and a rear separation wall 13. The interface part 30 is divided into a first interface chamber 301 and a second interface chamber 302 by a partition wall 14. The first interface chamber 301 is a space where the unprocessed wafers W are transferred toward the processing part 40. In the first interface chamber 301, a wafer drawing arm 311, a notch aligner 32, and a first posture changing apparatus 33 are provided, respectively.

The wafer drawing arm 311 corresponds to a substrate transfer mechanism of the present invention, and has a function for drawing a wafer W from the FOUP 10. When viewed from the front side, the wafer drawing arm 311 is movable in the right and left direction, movable upward and downward, and rotatable. The notch aligner 32 is adapted to rotate the respective wafers W, which have been drawn by the wafer drawing arm 311 and supported on a plurality of plates one by one, and to detect positions of notches formed in the respective wafers W by a photosensor or the like. Thus, the notch positions of the wafers W are aligned by the notch aligner 32, whereby the wafers W are arranged in position.

The first posture changing apparatus 33 is adapted to grasp the opposed ends of the side peripheries of the respective wafers W, which have been arranged in position by the notch aligner 32, and to horizontally hold the wafers W in a tier like manner in the up and down direction. After adjusting the intervals between the wafers W, as schematically shown in FIG. 3, the first posture changing apparatus 33 changes the horizontal posture of the respective wafers W to the vertical posture, by rotating the wafers W arranged in a tier-like manner at 90 degrees while grasping the opposed ends of the respective wafers W. In FIG. 3, the wafers W in the horizontal posture are shown by the solid lines, and the wafers W in the vertical posture are shown by the broken lines. The first posture changing apparatus 33 also correspond to the substrate transfer mechanism of the present invention.

On the other hand, the other second interface chamber 302 divided by the partition wall 14 is a space where the wafers W, which have been processed by the processing part 40, are transferred toward the FOUP 10. In the second interface chamber 302, a transport arm 35, a second posture changing apparatus 34, and a wafer delivering arm 312 are provided, respectively. The transport arm 35, the second posture changing apparatus 34, and the wafer delivering arm 312 correspond to the substrate transfer mechanism of the present invention.

The transport arm 35 receives the wafers W, which have been processed by the processing part 40 and are still arranged in the vertical state, and transfers the same. Contrary to the first posture changing apparatus 33, the second posture changing apparatus 34 has a function for changing the vertical posture of the wafers W to the horizontal posture. The wafer delivering arm 312 has substantially the similar structure as that of the aforementioned wafer drawing arm 311. The wafer delivering arm 312 is adapted to deliver the wafers W, which have been changed to the horizontal posture by the second posture changing apparatus 34, into the FOUP 10 stored in the loading and unloading part 20.

The processing part 40 includes a first processing unit 41 configured to remove particles and organic contaminations adhering to the wafers W that have been transferred from the interface part 30, a second processing unit 42 configured to remove metal contaminations adhering to the wafers W, a cleaning and drying unit 43 configured to remove chemical oxide films formed on the wafers W and dry the wafers W, a transfer arm 45 configured to transfer the wafers W among these units 41 to 43, and a chuck cleaning unit 44 configured to clean a wafer holding chuck disposed on the transfer arm 45.

As shown in FIGS. 2 and 4, in the processing unit 40, the cleaning and drying unit 43, the second processing unit 42, the first processing unit 41, and the chuck cleaning unit 44 are linearly arranged in this order from the front side. The transfer arm 45 is movable upward and downward and rotatable. In addition, the transfer arm 45 is movable in the fore and aft direction by a transfer track 46 disposed along the units 41 to 44 so as to guide the transfer arm 45. The function of the transfer arm 45 is to transfer and transport the wafers W among the respective units 41 to 43 and the interface part 30. The transfer arm 45 can transfer a plurality of, e.g., fifty wafers W in the vertical posture.

The first and second processing units 41 and 42 are structured as processing tanks capable of being filled with a chemical liquid, such as APM (Ammonium hydroxide-hydrogen Peroxide-Mixture) solution (mixture solution of ammonia, hydrogen peroxide solution, and deionized water) and HPM (HCl-hydrogen Peroxide-Mixture) solution (mixture solution of hydrochloric acid, hydrogen peroxide solution, and deionized water). The processing units 41 and 42 are equipped with wafer boats 411 and 421, respectively. The boats 411 and 421 can collectively transport the wafers W between the processing units 41 and 42 and the transfer arm 45, and can immerse the wafers W into the chemical liquid.

On the other hand, the cleaning and drying unit 43 is structured as a processing tank capable of being filled with a chemical liquid, e.g., hydrofluoric acid, for removing a chemical oxide film formed on a surface of the wafer W. The cleaning and drying unit 43 is equipped with a wafer boat 431 similar to those of the first and second processing units 41 and 42. In addition, after the removal of oxide film, in order to dry the wafers W, the cleaning and drying unit discharges the chemical liquid in the processing tank and supplies a drying steam (concretely, isopropyl alcohol (IPA) gas, for example) in the processing tank. For this purpose, the cleaning and processing unit 43 can form a sealed space by covering the processing tank with a hood 432. The chuck cleaning unit 44 has a function for cleaning the wafer holding chuck disposed on the transfer arm 45 by supplying thereto a deionized water, and thereafter drying the wafer holding chuck by supplying thereto a drying gas such as $N_2$ gas and an air.

In the wafer cleaning apparatus 1 as structured above, the loading and unloading part 20 has the structure in which the FOUP 10 can be transported between the loading and unloading part 20 and the OHT traveling along the in-step transfer path 102. By utilizing the two in-step transfer path 102, even in the wafer cleaning apparatus 1 capable of processing many wafers W, e.g., nine hundred wafers W per hour, the FOUPs 10 can be loaded and unloaded, without decelerating a process speed of the wafers W. Herebelow, the detailed structure of the loading and unloading part 20 is described.

Figure 5:
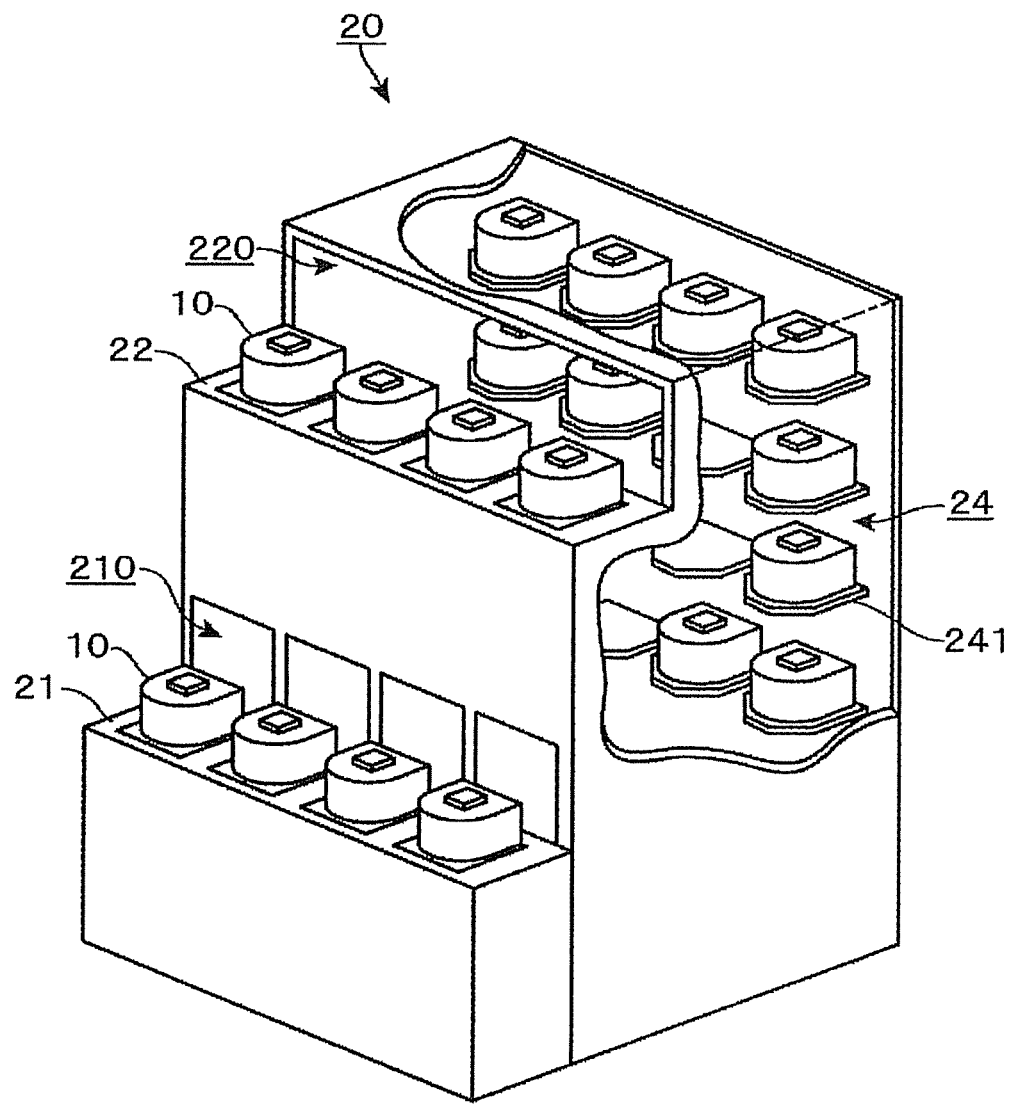
FIG. 5 is a partially cutaway perspective view showing a structure of a loading and unloading part disposed in the wafer cleaning apparatus.
Figure 6:
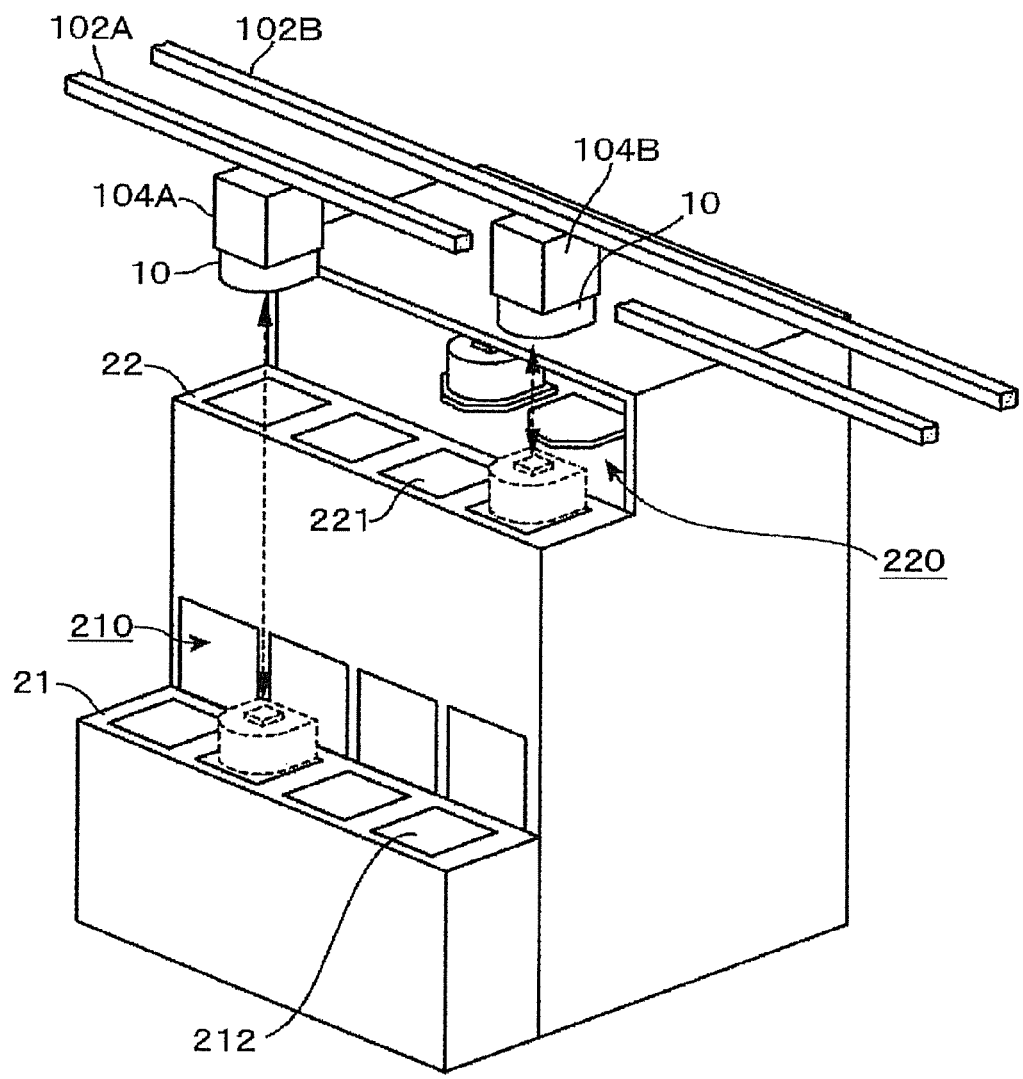
FIG. 6 is a perspective view showing a positional relationship between the loading and unloading part and a transfer path of the FOUP.

As shown in FIGS. 5 and 6, the loading and unloading part 20 in this embodiment includes a first load port 21 and a second load port 22, which are arranged at two levels on a front surface of the loading and unloading part 20 (outside the housing 11 defining the external body of the wafer cleaning apparatus 1). The first load port 21 is disposed on the forefront of the loading and unloading part 20, and is structured as a table on which a plurality of, e.g., four FOUPs 10 can be linearly placed in the width direction. The first load port 21 is located at a height position accessible not only from the step-in transfer path 102 but also from an operator and an AGV (Automated Guided Vehicle).

The second load port 22 is arranged stepwise on a position which is rearward the first load port 21 by a space corresponding to one FOUP 10, and is higher than the first load port 21 that is located at an about one-meter height position from a floor surface. Similarly to the first load port 21, the second load port 22 is structured as a table on which a plurality of, e.g., four FOUPs 10 can be linearly placed in the width direction. The second load port 22 is located at position which does not interfere with a height at which the FOUP 10 is transferred by means of the OHT. This position is also a highest at which the FOUPs 10 can be loaded into the loading and unloading part 20 and unloaded therefrom in the lateral direction, within a range from an upper part of the below-described openings 210 formed in the first load port 21 and a ceiling surface of the housing 11 of the wafer cleaning apparatus 1. The height up to the ceiling surface of the apparatus 1 is limited to, e.g., the transfer height of the FOUP 10. The transfer height of the FOUP 10 may be determined in conformity to the SEMI (Semiconductor Equipment and Materials International) standard. Thus, the space inside the loading and unloading part 20 can be enlarged, whereby the number of FOUPs 10 to be placed in the below-described stock area can be increased.

Figure 8:
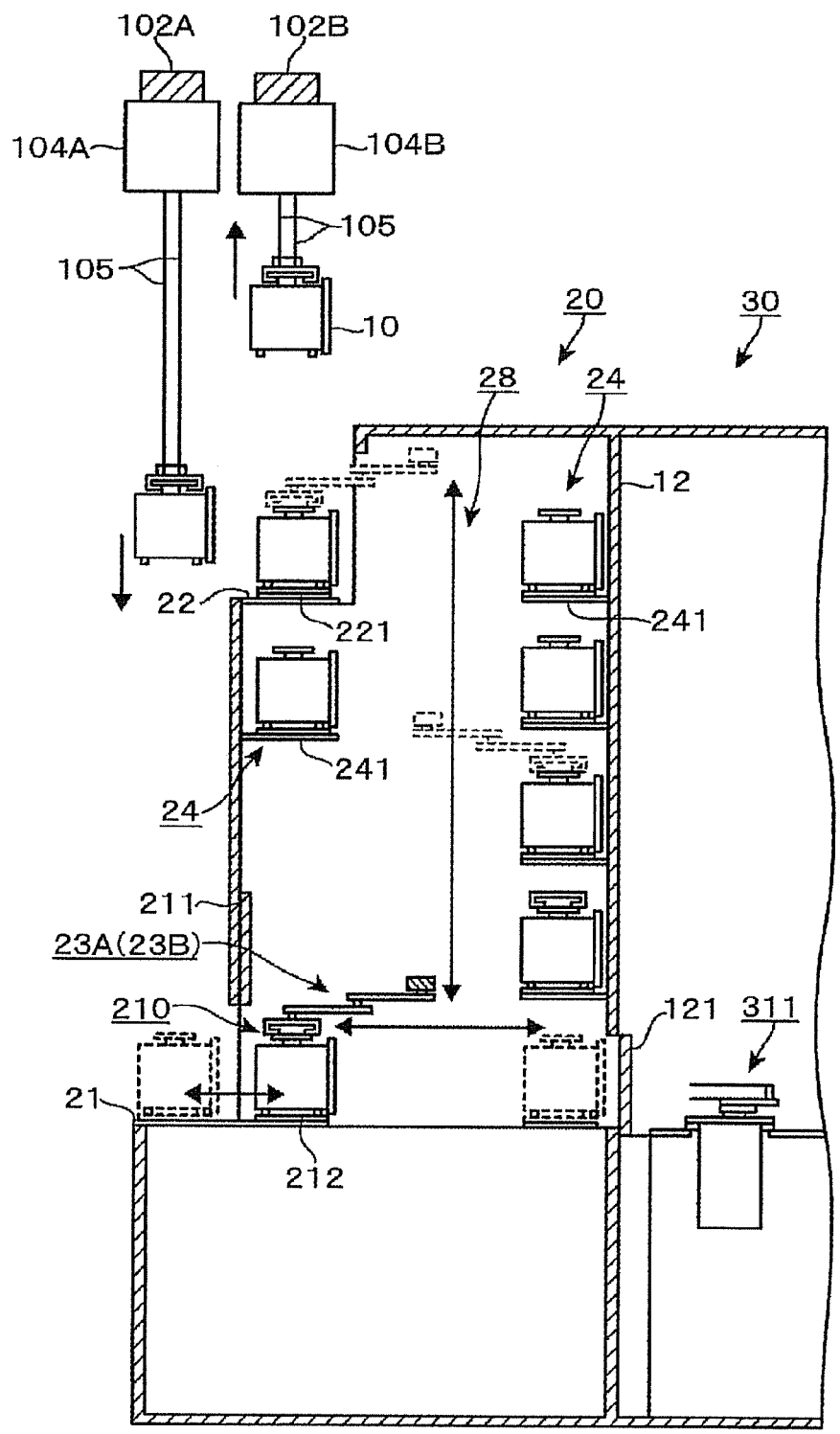
FIG. 8 is a longitudinal sectional view showing an inside structure of the loading and unloading part.

As shown in FIGS. 6 and 8, the wafer cleaning apparatus 1 is installed such that the area on which the FOUPs 10 are linearly placed on the first load port 21 corresponds to the one step-in transfer path 102A serving as a first transfer path, and that the area on which the FOUPs 10 are linearly placed on the second load port 22 corresponds to the other step-in transfer path 102B serving as a second transfer path. Thus, the FOUPs 10 are transported to the first load port 21 only from the OHT 104A serving as a first transfer apparatus traveling along the step-in transfer path 102A. On the other hand, the FOUPs 10 are transported to the second load port 22 only from the OHT 104B serving as a second transfer apparatus traveling along the step-in transfer path 102B.

In the following example, although there is described a case in which the first load port 21 is exclusively used for loading the FOUPs 10 to the wafer cleaning apparatus 1, and the second load port 22 is exclusively used for unloading the FOUPs 10 from the wafer cleaning apparatus 1, the use of the load ports 21 and 22 is not limited to the example.

The first load port 21 is provided with trays 212 serving as container tables disposed at positions where the FOUPs 10 are placed. In a side surface of the housing 11 of the loading and unloading part 20, there are formed openings 210 at positions opposed to the FOUPs 10 on the respective trays 212.

Figure 7:
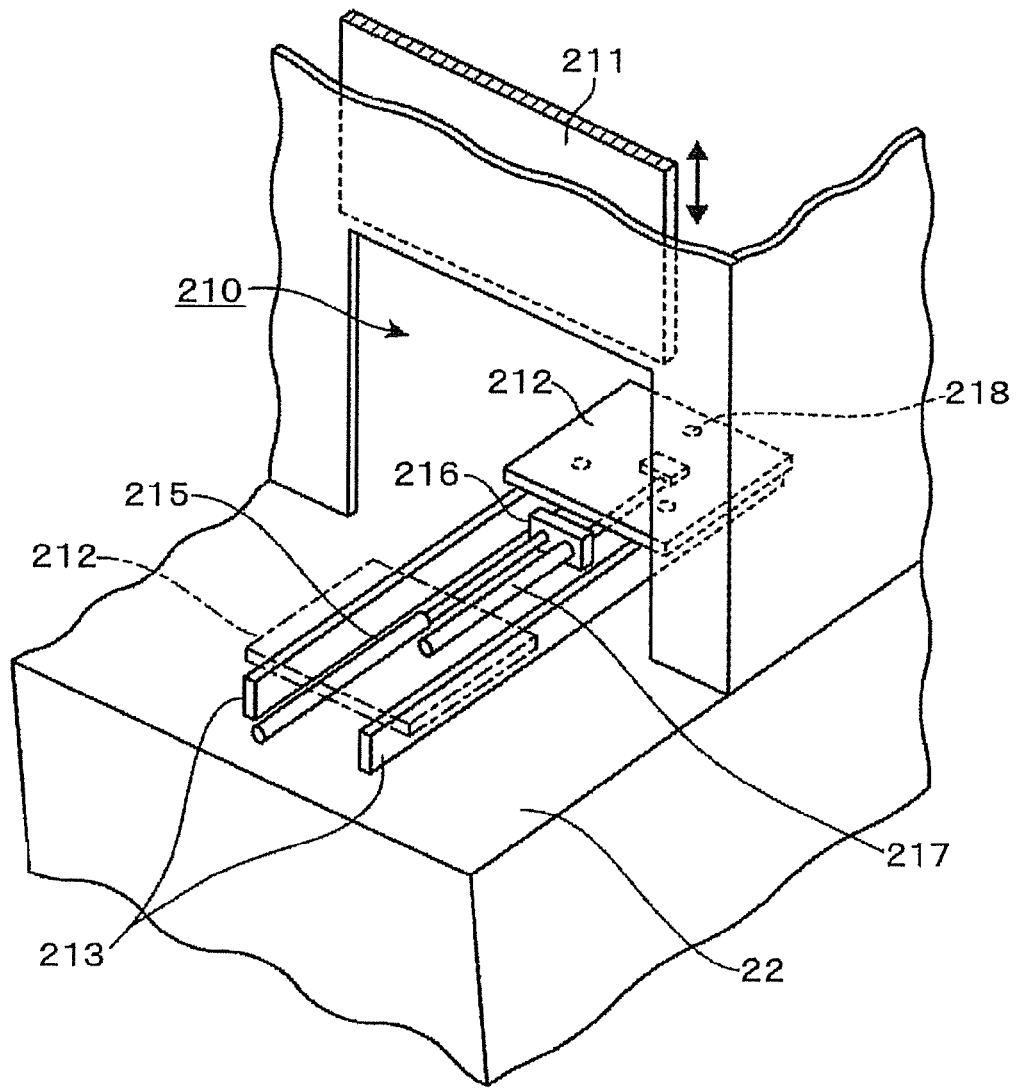
FIG. 7 is a perspective view of a mechanism that slides a tray disposed on a first load port of the loading and unloading part.

Each tray 212 is configured to be slidable in the fore and aft direction (movable in the horizontal direction). FIG. 7 shows a structure for sliding the tray 212. Elongated plate-like rail members 213 are secured below the tray 212 with a gap therebetween in the right and left direction when viewed from the front. The mechanism for sliding the tray 212 is disposed in a flat space defined between these rail members 213 and the tray 212. Included in this space are a first air cylinder 215 secured on a floor surface of the first load port, a plate 216 secured on a forefront end of an operating rod of the first air cylinder 215, and a second air cylinder 217 secured on the plate 216.

The tray 212 is secured on an operating rod of the second air cylinder 217 at a rear surface thereof. When the first air cylinder 215 is operated, the three members, i.e., the plate 216, the second air cylinder 217, and the tray 212, are pushed toward the opening 210, and when the second air cylinder 217 is further operated, the tray 212 is further pushed. Namely, a two-stage stroke structure is provided. Thus, the tray 212 can be slid, so that the FOUP 10 placed on the tray 212 can be moved between the first load port 21 and the loading and unloading part 20.

The aforementioned mechanism for sliding the tray 212 corresponds to an auxiliary transfer mechanism which is one of container transfer mechanisms for transferring the FOUP 10 between the first load port 21 and the inside position in the housing 11 opposed to the first load port 21 through the opening 210. In the drawings other than FIG. 7, illustration of the mechanism such as the first and second air cylinders 215 and 217 for sliding the tray 212 is omitted.

As described above, since the first load port 21 is disposed at the height position accessible from a person, as shown in FIGS. 7 and 8, each opening 210 can be closed by a shutter 211 except when the FOUP 10 is moved through the opening 210. The reference number 218 in FIG. 7 depicts a pin for securing the FOUP 10 on the tray 212.

Next, the second load port 22 is described. The second load port 22 is also provided with trays 221 serving as container tables disposed at positions where the FOUPs 10 are placed. In the side surface of the housing 11 of the loading and unloading part 20, there is formed an opening 220 at a position opposed to the FOUPs 10 placed on the respective trays 221. In this example, since the FOUP 10 placed on the second load port 22 is loaded into the loading and unloading part 20 by, e.g., a lifter 23A, which is described below, the tray 221 on the second load port 22 does not have a slidable structure. Since the opening 220 is disposed at a height position that is difficult to be accessible from a person, the opening 220 in the second load port 22 is not provided with a shutter. A shape of the opening 220 differs from that of the opening of the first load port 21, i.e., the opening 220 is of an elongated opening shape corresponding to the four trays 221.

As shown in FIGS. 5 and 8, a plurality of holding plates 241 are attached to, e.g., a wall surface of the separation wall 12 disposed in the loading and unloading part 20 for separating the loading and unloading part 20 and the interface part 30. In this example, for example, sixteen holding plates 241 are disposed in a four by four arrangement (four stages and four rows). In addition, four holding plates 241 in a one by four arrangement (one stage and four rows) are attached to the inside wall surface of the housing 11 below the second load port 22. Namely, the total of twenty holding plates 241 are disposed rearward (back surface side) of the first load port 21 and the second load port 22. These holding plates 241 serve as the container tables on which the vacant FOUPs 10 from which the wafers W have been drawn can be placed. The areas on which the holding plates 241 are disposed correspond to stock areas 24 for the FOUPs 10. The stock areas 24 correspond to the container storing part of the present invention. As a matter of course, the FOUP 10 containing the wafers W can be placed in the stock area 24.

Figure 10:
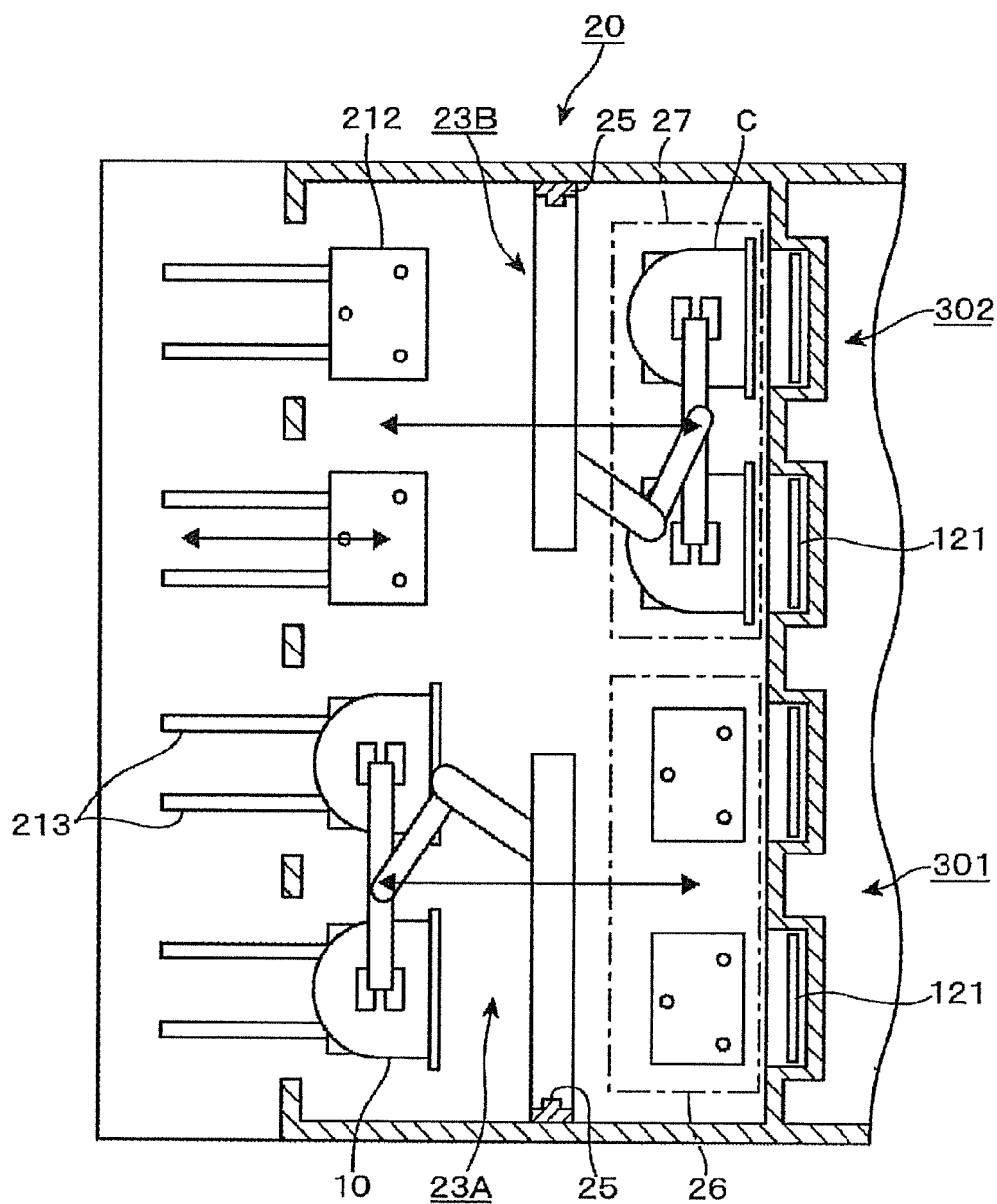
FIG. 10 is a first explanatory view showing an operation of the lifter.

In the loading and unloading part 20, the stock areas 24 are oppositely disposed along the side wall surface of the housing 11 on the front side and the surface of the separation wall 12 on the rear side. As shown in FIG. 8, formed between the stock areas 24 is an elevation space 28 in which the FOUP 10 can be elevated and lowered. As shown in FIGS. 1, 8, and 10, disposed in the elevation space 28 are the two lifters 23A and 23B serving as a main transfer mechanism which is one of the container transfer mechanisms of the present invention. When viewed from the front, the lifters 23A and 23B are horizontally extended from the right and left inner wall surfaces. Due to the lifters 23A and 23B, the FOUPs 10 can be freely transferred in the loading and unloading part 20.

Figure 9:
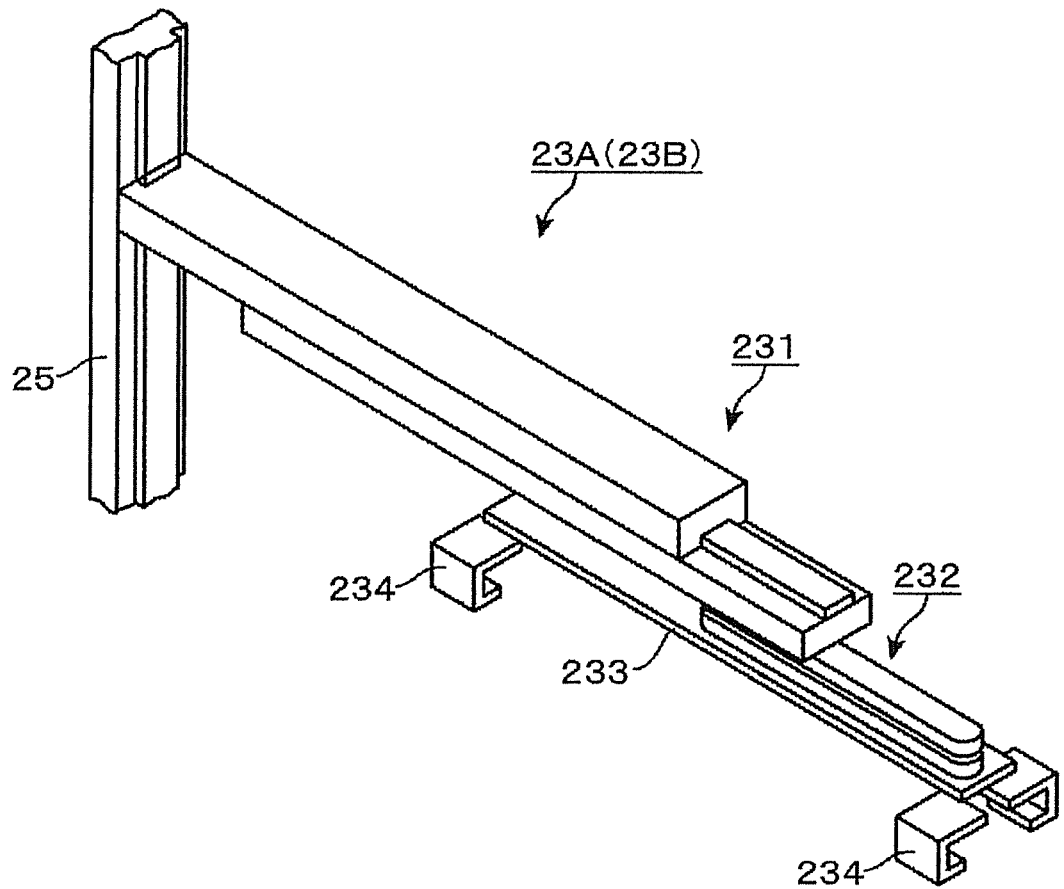
FIG. 9 is a perspective view showing a structure of a lifter disposed on the loading and unloading part.

As shown in FIG. 9, each of the lifters 23A and 23B has a structure in which grasping parts 234 for grasping a top flange of the FOUP 10 are disposed on opposed ends of an elongated plate-like fixing plate 233 that is extended in the right and left direction when viewed from the front side. Thus, the two FOUPs 10 can be simultaneously transferred by the respective lifters 23A and 23B. The fixing plate 233 is disposed on a distal end position of a scalar arm part 232 which is capable of extending in the fore and aft direction. An expandable arm part 231, which is capable of expanding and contracting in the right and left direction when viewed from the front side, is connected to a proximal end of the scalar arm part 232. A proximal end of the expandable arm part 231 is configured to be movable upward and downward along an elevation rail 25.

Figure 11:
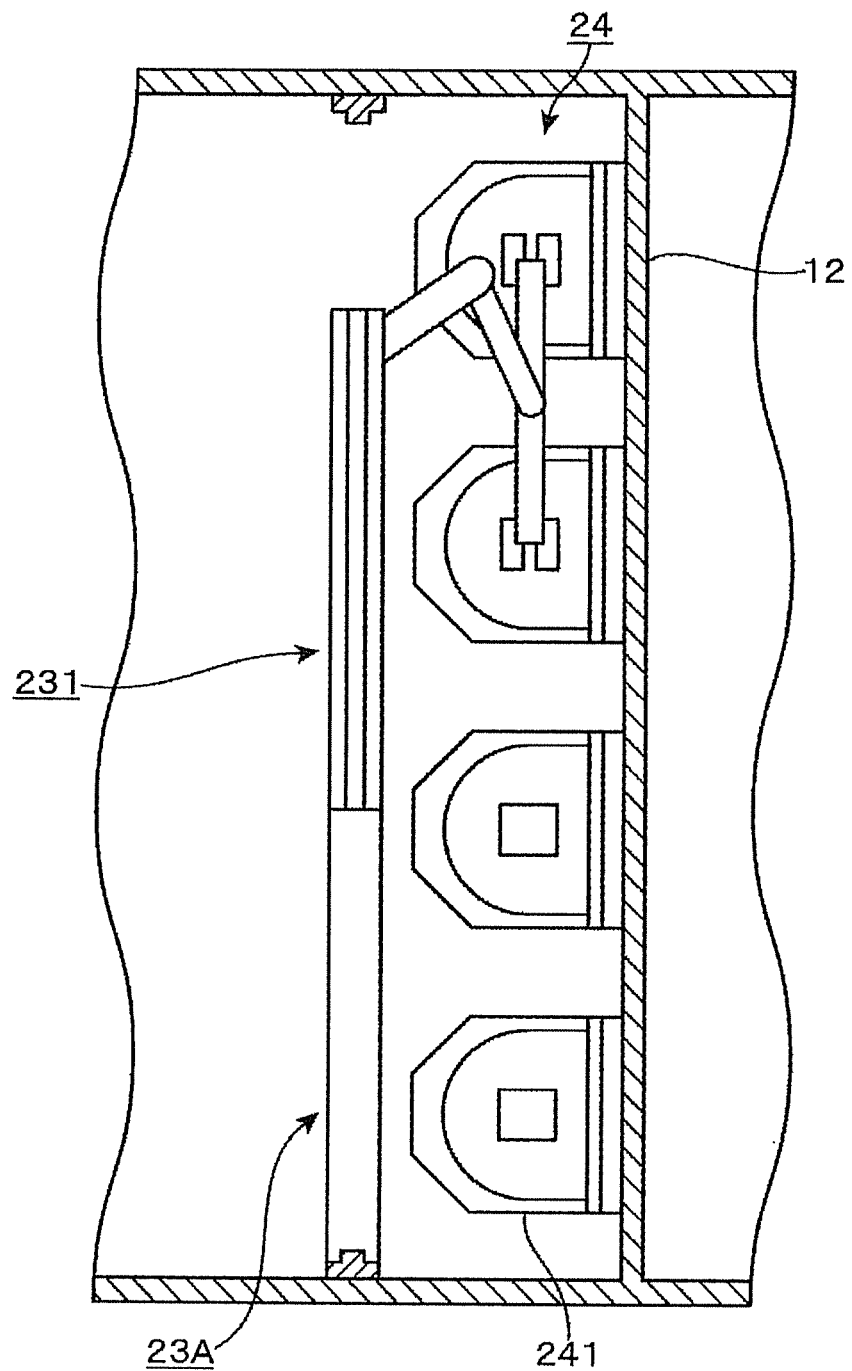
FIG. 11 is a second explanatory view showing the operation of the lifter.

Thus, as shown in FIG. 8, the lifters 23A and 23B are capable of moving upward and downward. Further, as shown in FIGS. 8 and 10, the lifters 23A and 23B are capable of extending in the fore and aft direction. Furthermore, as shown in FIG. 11, the lifters 23A and 23B are capable of expanding and contracting in the right and left direction when viewed from the front side. Thus, the lifters 23A and 23B can access the FOUPs 10 located in respective areas of the loading and unloading part 20, i.e., the FOUPs 10, which have been loaded into the loading and unloading part 20 (inside position of the housing 11) by sliding the trays 212, the FOUPs 10 placed on the second load port 22, the FOUPs 10 stored in the stock areas 24, and the FOUPs 10 placed on ports 26 and 27, which are described below, for accessing the interface part 30. As shown in FIG. 11, when the expandable arm part 231 of one of the lifters 23A and 23B is expanded, the other of the lifters 23A and 23B is retracted upward or downward.

As shown in FIG. 10, in the loading and unloading part 20, four ports 26 and 27 for accessing the interface part 30 are linearly arranged at a position below the rear stock areas 24. Among the four ports, the two ports disposed on the right side when viewed from the front side of the wafer cleaning apparatus 1 are the outlet ports 26 through which the wafers W are drawn from the FOUP 10 toward the first interface chamber 301, and the two ports disposed on the left side are the inlet ports 27 through which the wafers W are delivered the FOUP 10 from the second interface chamber 302. These outlet ports 26 and the inlet ports 27 correspond to a container table for transporting substrates of the present invention.

In front of each of the access ports 26 and 27, there is disposed an opening and closing door 121 which can be moved upward and downward between a position opposed to the FOUP 10 and a retracted position therebelow. The opening and closing door 121 can open and close the lid member disposed on the side surface of the FOUP 10, for drawing the wafers W from the FOUP 10 and delivering the wafers W into the FOUP 10.

As shown in FIG. 2, the wafer cleaning apparatus 1 as structured above is connected to a control device 5. The control device 5 is formed of, e.g., a computer, not shown, including a CPU and a storage part. The storage part stores a program including a control step (instruction) group. In accordance with the control step group, the FOUPs 10 are loaded into the respective loading and unloading parts 20, the wafers W are drawn therefrom and are subjected to various liquid processes, the wafers W are then delivered into the FOUPs 10, and the FOUPs 10 are unloaded. This program is stored in a storage medium, such as a hard disc, a compact disc, a magneto optical disc, and a memory card, and is installed in the computer.

An operation of the wafer cleaning apparatus 1 as structure above is described. As shown in FIG. 8, the FOUP 10 containing the wafers W, which haven been processed by another substrate processing apparatus 103, is transferred by the OHT 104A along the step-in transfer path 102A. When the FOUP 10 reaches the upper part of the wafer cleaning apparatus of this embodiment, the OHT 104A extends an elevation belt 105 so as to lower the FOUP 10, such that the FOUP 10 is placed on one of the trays 212 of the first load port 21.

After the FOUP 10 has been placed on the first load port 21, the shutter 211 is opened, and the tray 212 is slid so as to load the FOUP 10 into the loading and unloading part 20. Then, the FOUP 10 is lifted up from the tray 212 by the lifter 23A, for example, which is disposed on the right side when viewed from the front, and the FOUP 10 is placed on the outlet port 26. The lid member of the FOUP 10 placed on the outlet port 26 is detached by the opening and closing door 121. Then, the wafer drawing arm 311 enters the FOUP 10 so that the wafers W are drawn therefrom and loaded into the first interface chamber 301. The lid member of the vacant FOUP 10 from which the wafers W have been drawn is closed, and the FOUP 10 is transferred by, e.g., the lifter 23A to the stock area 24. In the stock area 24, the FOUP 10 is stored until the process for the wafers W is finished.

The wafers W loaded into the first interface chamber 301 are positioned by the notch aligner 32, and the gaps therebetween and the postures thereof are adjusted and changed by the first posture changing apparatus 33. Thereafter, the wafers W are transported to the transfer arm 45 entering the interface part 30. The wafers W held by the transfer arm 45 are transported to the wafer boat 411 of the first processing unit 41. Then, the wafers W are immersed into the APM solution in the processing tank. After particles and organic contaminations have been removed, the wafers W are cleaned by a cleaning liquid (e.g., deionized water).

The wafers W, which have been subjected to the primary cleaning process in the first processing unit 41, are again transported to the transfer arm 45, and are transported to the wafer boat 421 of the second processing unit 42. Then, the wafers W are immersed into a chemical liquid such as the HPM solution. After metal contaminations have been removed, the wafers W are cleaned by deionized water. The wafers W, which have been subjected to the secondary cleaning process, are again transported to the transfer arm 45. The wafers W are transferred to the cleaning and drying unit 43 and transported to the wafer boat 431. Then, a removal process for removing chemical oxide films by hydrofluoric acid, and a drying process by IPA gas are performed.

After the dried wafers W have been transported to the transport arm 35 in the second interface chamber 302, the posture of the wafers W is changed from the vertical state to the horizontal state by the second posture changing apparatus 34. Simultaneously with this operation, the lifter 23B, for example, disposed on the left side when viewed from the front side, transfers the FOUP 10 stored in the stock area 24 to the inlet port 27. On the inlet port 27, the FOUP 10 waits with its lid member being detached by the opening and closing door 121.

The wafer delivering arm 312 loads the wafers W from the second posture changing apparatus 34 into the FOUP 10 on the inlet port 27. After the wafers W have been loaded thereinto, the lid member is closed. Then, the FOUP 10 is lifted by, e.g., the lifter 23B, and is elevated in the elevation space 28, so that the FOUP 10 is placed on the second load port 22. The FOUP 10 placed on the second load port 22 is lifted from the second load port 22 by the OHT 104B traveling along the step-in transfer path 102B extended above the second load port 22, and is then transferred to the succeeding substrate processing apparatus 103. In the wafer cleaning apparatus 1, the aforementioned operation is continuously repeated, whereby the nine hundred wafers W per hour, for example, are processed.

According to the wafer cleaning apparatus 1 in this embodiment, the following effects can be produced. There is used the transfer system including the step-in transfer paths 102A and 102B serving as the first transfer path and the second transfer path whose lateral positions differ from each other above the wafer cleaning apparatus 1, and the OHTs 104A and 104B which respectively transfer the FOUPs 10 along the step-in transfer paths 102A and 102B. On the other hand, correspondingly to the two OHTs 104A and 104B, the wafer cleaning apparatus 1 includes the first load port 21 (lower level (the first load port 21 is accessible from a floor side by a person and an AGV)) and the second load port 22 (upper level) which are arranged at two levels. Thus, the number of times at which the FOUPs 10 are transported between the OHTs 104A and 104B and the wafer cleaning apparatus 1 can be increased, whereby the wafers W can be processed with high throughput.

In addition, the FOUPs 10 are loaded and unloaded, with the first load port 21 being exclusively used for loading and the second load port 22 being exclusively used for unloading. Thus, the FOUP loading operation and the FOUP unloading operation by the OHTs 104 traveling along the two step-in transfer path 102 do not cross each other, so that the FOUPs 10 can be smoothly loaded and unloaded. However, the use of the first and second load ports 21 and 22 are not limited to the above case, and the wafers W may be loaded and unloaded on both the load ports 21 and 22.

As described with reference to FIGS. 5 and 6, in this example, the height position at which the second load port 22 is disposed is the highest height position within a constraint range of the apparatus height of the wafer cleaning apparatus 1, such that the height position of the second load port 22 does not interfere with a height at which the FOUP 10 is transferred by the OHT, which is determined by the SEMI standard, for example. Thus, the space in the loading and unloading part 20 can be enlarged, so that the number of FOUPs 10 to be placed in the stock areas 24 can be increased as much as possible.

Therefore, for example, an OHT that travels at a height position higher than the SEMI standard may be developed so as to make higher the apparatus height of the wafer cleaning apparatus 1, and the second load port 22 may be disposed at a higher height position correspondingly thereto. In this case, the number of FOUPs 10 to be placed in the stock areas 24 can be increased.

On the other hand, the height position at which the second load port 22 is disposed is not limited to the uppermost position of the apparatus height of the wafer cleaning apparatus 1, and the second load port 22 may be disposed at a lower position. When the FOUPs 10 are loaded and unloaded, the effect of the present invention can be obtained, as long as the wafer cleaning apparatus 1 and the second load port 22 are arranged stepwise in this order from below, and vertical trajectories along which the FOUPs 10 are transported between the step-in transfer paths 102A and 102B and horizontal trajectory through which the FOUPs are loaded and unloaded with respect to the loading and unloading part 20 do not intersect with each other, i.e., do not interfere with each other.

Further, the number of the load ports disposed on the loading and unloading part 20 of the wafer cleaning apparatus 1 is not limited to two, and three or more load ports may be disposed in accordance with the number of the step-in transfer paths 102 disposed in the processing block B. In this case, the lower load port of the selected two load ports disposed on the loading and unloading part 20 corresponds to the first load port, and the upper load port thereof corresponds to the second load port.

Furthermore, not limited to the batch-type cleaning apparatus, the first load port and the second load port of the present invention, which are arranged stepwise, may be applied to a coating and developing apparatus.

In the wafer cleaning apparatus 1 in this embodiment, although the first transfer path used in the transfer system is disposed above the wafer processing apparatus 1, the first transfer path may be disposed on a floor surface on which the wafer processing apparatus is installed.

The invention claimed is:

1. A substrate processing apparatus comprising a loading and unloading part provided to load and unload a transfer container of a plurality of transfer containers containing substrates, and a processing part provided to perform a treatment to a substrate removed from the transfer container loaded into the loading and unloading part, said loading and unloading part including:

an outer housing of said substrate processing apparatus;

a first load port arranged outside the outer housing and having a plurality of first container tables, wherein the first container tables are arrayed in a row parallel with a first transfer path to allow a transfer container of said plurality of transfer containers containing substrates to be loaded and unloaded to and from a first container table of said plurality of first container tables by a first transfer apparatus provided to move along the first transfer path above the first container tables;

a second load port arranged outside the outer housing and having a plurality of second container tables, wherein the second container tables are arrayed in a row parallel with a second transfer path to allow a transfer container of said plurality of transfer containers containing substrates to be loaded and unloaded to and from a second container table of said plurality of second container tables by a second transfer apparatus provided to move along the second transfer path above the second container tables, wherein an array of the second container tables is disposed in parallel with an array of the first container tables, behind the array of the first container tables, and at a level higher than the array of the first container tables;
a table moving mechanism configured to horizontally move each of the first container tables between a front position where the first container table is in the first load port and a rear position where the first container table is located within the outer housing;
a third container table arranged in the outer housing for placing a transfer container of said plurality of transfer containers thereon;
a substrate transfer mechanism configured to remove a substrate of said substrates to be subjected to the treatment in the processing part from a transfer container of said plurality of transfer containers placed on the third container table;
a container storing part disposed in the outer housing and provided therein with a plurality of fourth container tables, each for placing a transfer container of said plurality of transfer containers thereon, wherein some of the fourth container tables are located vertically between the first container tables in the rear position and the second container tables; and
a container transfer mechanism configured to place and remove a transfer container of said plurality of transfer containers to and from the first, second, third and fourth container tables and transfer the transfer container of said plurality of transfer containers between the tables, which are respectively located at different positions.

2. The substrate processing apparatus according to claim 1, further comprising a shutter for closing an opening of the housing, except when a transfer container of said plurality of transfer containers is moved between the first load port and an area within the housing.

3. The substrate processing apparatus according to claim 1, wherein one of the first load port and the second load port is exclusively used for loading a transfer container of said plurality of transfer containers, and the other thereof is exclusively used for unloading a transfer container of said plurality of transfer containers.

\* \* \* \* \*